United States Patent [19]

Takeshita et al.

[11] Patent Number: 5,019,554
[45] Date of Patent: May 28, 1991

[54] STRUCTURE OF SUPERCONDUCTIVE WIRING HAVING SIALON BUFFER LAYER THEREUNDER

[75] Inventors: Takuo Takeshita; Tadashi Sugihara, both of Saitama, Japan

[73] Assignee: Mitsubishi Metal Corp., Tokyo, Japan

[21] Appl. No.: 415,355

[22] PCT Filed: Dec. 23, 1988

[86] PCT No.: PCT/JP88/01309
§ 371 Date: Aug. 18, 1989
§ 102(e) Date: Aug. 18, 1989

[87] PCT Pub. No.: WO89/06440
PCT Pub. Date: Jul. 13, 1989

[30] Foreign Application Priority Data

Dec. 25, 1987 [JP] Japan .................. 62-332981

[51] Int. Cl.$^5$ .................. C04B 41/89; H01B 12/06; H01L 21/88
[52] U.S. Cl. .................. 505/1; 29/599; 427/62; 428/633; 428/930; 505/701; 505/702; 505/704; 505/730
[58] Field of Search .................. 428/633, 930; 29/599; 505/1, 701, 702, 704, 730; 427/62

[56] References Cited

U.S. PATENT DOCUMENTS

| | | | |
|---|---|---|---|
| 4,826,808 | 5/1989 | Yurek et al. | 505/1 |
| 4,882,312 | 11/1989 | Mogro-Campero et al. | 427/62 |
| 4,900,709 | 2/1990 | Heijman et al. | 427/62 |

FOREIGN PATENT DOCUMENTS

| | | | |
|---|---|---|---|
| 0298866 | 1/1989 | European Pat. Off. | 428/930 |
| 0161731 | 6/1989 | Japan | 505/1 |

OTHER PUBLICATIONS

Naito et al., Jour. Mat. Res., 2(6), Nov.–Dec. 1987, p. 713.
Gupta et al., Appl. Phys. Letts., 52 (Jun. 1988), 1987, Hammond et al.
MRS Conf., Annheim, Calif., Apr. 1987, p. 169.
Nakayama et al., Jap. Jour. Appl. Phys., 26 (Dec. 1987), L-2055.
Jin et al., Appl. Phys. Letts, 51 (Jul. 1987), 203.
Gurevitch et al., Appl. Phys. Letts., 51 (28 Sep. 1987), 1027.
Guarnieri et al., in AIP Conf. #166, ed. Harper et al., Nov. 6, 1987, N.Y., 204.
Chien et al., Appl. Phys. Letts., 51 (21 Dec. 1987), 2155.
Inoue et al., Jap. Jour. Appl. Phys., 26 (Sep. 1987), L-1443.

*Primary Examiner*—Upendra Roy
*Attorney, Agent, or Firm*—Sughrue, Mion, Zinn, Macpeak & Seas

[57] ABSTRACT

The structure of a wiring according to the present invention has a buffer layer interposed between an insulating layer and a wiring of a superconductive ceramic material, and the buffer layer hardly reacts on the superconductive ceramic material in a high temperature ambient, so that the superconductive ceramic material does not lose the superconductivity due to an influence of the buffer layer on the superconductive ceramic material during the formation stage of the wiring.

4 Claims, 1 Drawing Sheet

STRUCTURE OF SUPERCONDUCTIVE WIRING HAVING SIALON BUFFER LAYER THEREUNDER

TECHNICAL FIELD

This invention relates to a structure of a superconductive wiring and, more particularly, to a structure of a superconductive wiring used for fabricating a thin film integrated circuit, a thick film integrated circuit and so forth.

BACKGROUND ART

An example of the prior art superconductive wiring is shown in FIG. 1. The structure of the wiring is disclosed in the paper entitled as "Technology of Superconductive Wiring on Alumina Substrate", Electronic Parts and Material published by Association of Industrial Investigation, 1987 August, pages 89 to 92.

Referring to FIG. 1, reference numeral 1 designates a high purity alumina substrate, and the high purity alumina substrate is sometimes abbreviated as FGA (Fine Grained Alumina) substrate. On the high purity alumina substrate 1 a thick film wiring 2 is formed. The process of forming the thick film wiring 2 starts with preparation of a powder of yttria represented by the molecular formula of $Y_2O_3$, a powder of the barium oxide represented by the molecular formula of $BaO$ and a powder of the copper oxide represented by the molecular formula of $CuO$. These powders are calcined to produce a bulk solid of a superconductive ceramic material. The bulk solid of the superconductive ceramic material is pulverized to produce a powder of the superconductive ceramic material, and the powder of the superconductive ceramic material is mixed into an organic vehicle, so that a paste is formed. The paste is printed on the high purity alumina substrate 1 by using a screen printing technique, and, thereafter, the high purity alumina substrate is placed in the atmospheric ambient at about 800 degrees to about 1000 degrees in centigrade for sintering, then a thick film wiring strip 2 being formed.

However, a problem is encountered in the quality of the substrate usable. Namely, even if the paste of the superconductive ceramic material is printed on a low purity alumina substrate available in the market and a thick film wiring strip is, then, produced through a process sequence similar to that described above, the thick film wiring strip does not show any superconductivity. This is because of the fact that the low purity alumina substrate available in the market contains a large amount of impurities such as silicon dioxide. It is figured that the impurities react on the paste during the sintering stage and, for this reason, an occurrence of the superconductivity is suppressed in the thick film wiring strip. Such a phenomenon is reported in JAPANESE JOURNAL OF APPLIED PHYSICS, 1987 May, VOL. 26 No. 5, Table 1 in page L761.

It is therefore an object of the present invention to provide a structure of a superconductive wiring feasible for fabrication on a low purity substrate available in the market.

DISCLOSURE OF INVENTION

A structure of a superconductive wiring according to the present invention comprises an insulating layer, a buffer layer formed on the insulating layer, and a wiring pattern having a wiring strip formed of a superconductive ceramic material containing at least one element selected from the group consisting of scandium, yttrium and lanthanides, at least one alkaline earth metal, copper and oxygen, and the buffer layer is formed of a substance hardly reacting on the superconductive ceramic material in a high temperature ambient, in which the substance is represented by the chemical formula SiAlON.

The superconductive ceramic material may contain a plurality of elements selected from the group consisting of scandium, yttrium and lanthanides, a plurality of alkaline earth metals, copper and oxygen.

The aforementioned structure of the superconductive wiring according to the present invention is provided with the buffer layer interposed between the insulating layer and the wiring pattern, and the buffer layer hardly reacts on the superconductive ceramic material in a high temperature ambient. For this reason, when the wiring strip of the superconductive ceramic material is formed on the buffer layer, the wiring strip continues to show the superconductivity even though the insulating layer is low in purity. This results in that a thick film integrated circuit is capable of being formed on, for example, an inexpensive low purity substrate, and, accordingly, the thick film integrated circuit is decreased in the production cost.

If the substance used for the buffer layer is larger in thermal expansion coefficient than the substance used for the insulating layer but smaller than the superconductive ceramic material, the thermal stresses between the wiring pattern and the buffer layer and between the buffer layer and the insulating layer are decreased, and, for this reason, the structure of the superconductive wiring is prevented from a peeling and so forth. Moreover, if the buffer layer is formed of a substance with a perovskite crystal structure, the superconductive ceramic material is grown on the buffer layer in a lattice matched structure, and, accordingly, the superconductive ceramic material is chemically stable. Additionally, the superconductive ceramic material grown on the buffer layer with the perovskite crystal structure is superior in electric properties, and a high current density is by way of example achieved.

BEST MODE FOR CARRYING OUT THE INVENTION

Figure 2:
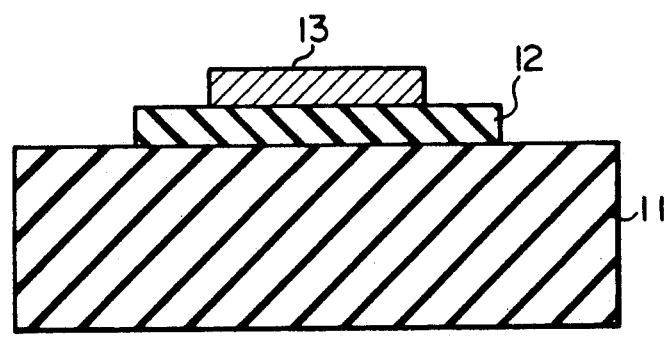
FIG. 2 is a cross sectional view showing the structure of a superconductive wiring according to the present invention.
Figure 1:
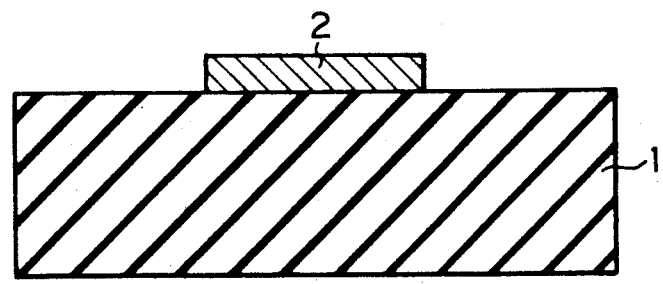
FIG. 1 is a cross sectional view showing the structure of the prior art superconductive wiring.

Referring to FIG. 2, there is shown the structure of a superconductive wiring according to the present invention. The structure shown in FIG. 2 is a kind of wiring incorporated in a thick film integrated circuit and comprises a low purity alumina substrate 11 available in the market and serving as an insulating layer, a buffer layer 12 formed on the alumina substrate 11, and a wiring pattern 13 on the buffer layer 12. However, a passivation film may cover the buffer layer 12 as well as the wiring pattern 13 in another example.

Although the alumina substrate 11 is used in the example shown in FIG. 2, the insulating layer would be formed of silicon dioxide in the case where the present invention is applied to a thin film integrated circuit. The alumina has a thermal expansion coefficient of about $8.8 \times 10^{-6}$/degree in centigrade, and silicon dioxide is averaged in the thermal expansion coefficient to be about $12 \times 10^6$/degree in centigrade.

The wiring pattern 13 is formed of an oxide containing at least one element selected from the group consisting of scandium, yttrium and lanthanides, at least an alkaline earth metal such as, for example, calcium, strontium, barium or radium, and copper, and such an oxide is known as a superconductive ceramic material. One of the superconductive ceramic materials is, by way of example, an yttrium-barium-copper oxide, and the thermal expansion coefficient thereof is about $17 \times 10^{-6}$/degree in centigrade within the range from about 400 degrees to about 800 degrees in centigrade. Other examples of the superconductive ceramic material are oxides respectively represented by the molecular formula of $(LaBa)_2CuO$ and the molecular formula of $YbBa_2Cu_3O_6$. $(Gd_{0.5}Ho_{0.5})_{1.0}(Ba_{0.9}Sr_{0.1})_{2.0}Cu_{3.0}O_{6.9}$ is an example of the oxide containing a plurality of elements selected from the group consisting of scandium, yttrium and lanthanides, a plurality of alkaline earth metals, and copper. Additionally, it is unnecessary to the wiring pattern 13 in its entirety to be formed of a superconductive ceramic material, but a wiring strip of the superconductive ceramic material should be contained therein. In this instance, only the wiring strip of the superconductive ceramic material may be formed on the buffer layer 12.

The buffer layer 12 is formed of a substance which does not react on the superconductive ceramic material in a high temperature ambient of, for example, 800 degrees in centigrade. Some examples of such a substance are oxides represented by the molecular formula of MgO and the molecular formula of $SrTiO_3$, respectively, and the yttrium stabilized zirconium (which is abbreviated as YSZ). These substances respectively have thermal expansion coefficients of about $14 \times 10^{-6}$/degree in centigrade, about $9 \times 10^{-6}$/degree in centigrade and about $10 \times 10^{-6}$/degree in centigrade. Other substances available for the buffer layer 12 are oxides represented by the molecular formulae of $BaTiO_3$, $BaZrO_3$, $CaTiO_3$, $SrZrO_3$, $PbTiO_3$, and the thermal expansion coefficients thereof are about $14 \times 10^6$/degree in centigrade, about $8 \times 10^{-6}$/degree in centigrade, $14 \times 10^{-6}$/degree in centigrade, about $9 \times 10^{-6}$/degree in centigrade, about $25 \times 10^{\times 6}$/degree in centigrade and about $32 \times 10^{-6}$/degree in centigrade. The oxide represented by the molecular formula of $SrTiO_3$ has a perovskite crystal structure and, for this reason, is desirable to grow the crystal structure of a superconductive ceramic material. Namely, the oxide represented by the molecular formula of $SrTiO_3$ is similar in crystal structure to the superconductive ceramic material with a perovskite crystal structure of the oxide defect type, and, moreover, the lattice constant is nearly equal to that of the superconductive ceramic material, so that the superconductive ceramic material is improved in orientation. Moreover, the material represented by the molecular formula of SiAlON is superior in corrosion resistance, and, accordingly, cracks are less liable to take place due to heat repetition. In the case where the buffer layer of a magnesium oxide is formed on the alumina substrate or a silicon dioxide layer, since the thermal expansion coefficient of the magnesium oxide is greater than the thermal expansion coefficient but less than the thermal expansion coefficient of the superconductive ceramic material, thermal stresses between the alumina substrate and the buffer layer and between the buffer layer and the wiring pattern are decreased in value in comparison with the thermal stress produced in the prior art structure, and, accordingly, peeling and/or cracks are less liable to take place. In still another example, the buffer layer may be formed of a conductive substance such as a noble metal of, for example, platinum.

The above mentioned buffer layer may be formed by using a screen printing technique followed by a sintering stage or by using a sputtering technique. Description is hereinunder made for a process sequence where the sputtering technique is applied to the formation of the buffer layer.

The process starts with preparation of a target of a superconductive ceramic material, a target of the yttria stabilized zirconium and an alumina substrate 11. First, a solution of photoresist is dropped onto the alumina substrate 11, then being spun at about 5000 rpm for coating with a photoresist film. The photoresist film is baked to form a photoresist layer, and the photoresist layer is exposed through a mask, then partially removing a portion shielded with the mask in the development stage. As a result, the alumina substrate 11 is partly exposed. Then, the target of the yttria stabilized zirconium is sputtered, so that a yttria stabilized zirconia layer is deposited on the photoresist layer as well as the exposed part of the alumina substrate 11. When the photoresist layer is removed by using a lift-off technique, a buffer layer 12 is patterned on the alumina substrate 11.

In a similar manner, a photoresist layer of about 10 microns thick is formed in such a manner as to cover the entire structure, and, thereafter, the photoresist layer is patterned by using lithographic techniques. The resultant structure is placed in an argon ambient of, for example, about $10^{-4}$ torr to $10^{-1}$ torr, and the target of the superconductive ceramic material is sputtered therein. As a result, the superconductive ceramic layer is deposited thereon, and a wiring pattern 13 of the superconductive ceramic material is formed on the buffer layer 12 after the removal of the photoresist layer by using the lift-off technique.

INDUSTRIAL APPLICABILITY

The structure of the superconductive wiring according to the present invention serves as an interconnection for semiconductor chips incorporated in a thick film integrated circuit as well as an interconnection for component circuit elements incorporated in a thin film integrated circuit.

We claim:
1. A superconductive wiring structure comprising:
an insulating layer,
a buffer layer formed on said insulating layer, and
a wiring pattern formed on said buffer layer having a wiring strip formed of a superconductive ceramic material containing at least one element selected from the group consisting of scandium, yttrium and lanthanides, at least one alkaline earth metal, copper and oxygen, wherein said buffer layer is formed of SiAlON, which is a substance hardly reacting on said superconductive ceramic material in a high temperature ambient.

2. A structure of a superconductive wiring as set forth in claim 1, said high temperature ambient is about 800 degrees in centigrade.

3. A structure of a superconductive wiring as set forth in claim 1, in which said insulating layer is formed of a substance selected from the group consisting of an alumina and silicon dioxide.

4. A superconductive wiring structure comprising:
an insulating layer,
a buffer layer formed on said insulating layer, and
a wiring pattern formed on said buffer layer and having a wiring strip formed of a superconductive ceramic material containing a plurality of elements selected from the group consisting of scandium, yttrium and lanthanides, a plurality of alkaline earth metals, copper and oxygen, wherein said buffer layer is formed of SiAlON material.

* * * * *